United States Patent
Chen et al.

(10) Patent No.: US 9,362,456 B2
(45) Date of Patent: Jun. 7, 2016

(54) OPTOELECTRONIC SEMICONDUCTOR DEVICE

(71) Applicant: EPISTAR CORPORATION, Hsinchu (TW)

(72) Inventors: Wei-Yo Chen, Hsinchu (TW); Yen-Wen Chen, Hsinchu (TW); Chien-Yuan Wang, Hsinchu (TW); Min-Hsun Hsieh, Hsinchu (TW); Tzer-Perng Chen, Hsinchu (TW)

(73) Assignee: EPISTAR CORPORATION, Hsinchu (TW)

( * ) Notice: Subject to any disclaimer, the term of this patent is extended or adjusted under 35 U.S.C. 154(b) by 0 days.

(21) Appl. No.: 13/625,139

(22) Filed: Sep. 24, 2012

(65) Prior Publication Data

US 2013/0015584 A1 Jan. 17, 2013

Related U.S. Application Data

(63) Continuation of application No. 12/591,617, filed on Nov. 25, 2009, now Pat. No. 8,274,156.

(30) Foreign Application Priority Data

Nov. 26, 2008 (TW) .............................. 97146075 A

(51) Int. Cl.
| | | |
|---|---|---|
| *H01L 33/00* | (2010.01) | |
| *H01L 33/38* | (2010.01) | |
| *H01L 31/0224* | (2006.01) | |
| *H01L 23/00* | (2006.01) | |

(52) U.S. Cl.
CPC ........ *H01L 33/38* (2013.01); *H01L 31/022408* (2013.01); *H01L 31/022433* (2013.01); *H01L 24/02* (2013.01); *H01L 33/382* (2013.01); *H01L 2924/01078* (2013.01); *H01L 2924/01079* (2013.01); *H01L 2924/12041* (2013.01); *H01L 2924/12042* (2013.01); *H01L 2924/12044* (2013.01); *Y02E 10/50* (2013.01)

(58) Field of Classification Search
USPC .................. 257/99, 431–436, 459, 773, 776, 257/E33.001, E33.062, E33.065, E31.001, 257/E31.124, E23.143, E23.169, E23.151, 257/E23.152, E23.17, E23.175, 23.143; 438/106, 666
See application file for complete search history.

(56) References Cited

U.S. PATENT DOCUMENTS

| | | | |
|---|---|---|---|
| 5,977,565 | A | 11/1999 | Ishikawa et al. |
| 6,307,218 | B1 | 10/2001 | Steigerwald et al. |
| 6,445,007 | B1 | 9/2002 | Wu et al. |
| 6,642,548 | B1 | 11/2003 | Brown et al. |
| 7,679,097 | B2 | 3/2010 | Akaishi |

(Continued)

*Primary Examiner* — Victoria K Hall
(74) *Attorney, Agent, or Firm* — Bacon & Thomas, PLLC

(57) ABSTRACT

An optoelectronic semiconductor device includes a substrate, a semiconductor system having an active layer formed on the substrate and an electrode structure formed on the semiconductor system, wherein the layout of the electrode structure having at least a first conductivity type contact zone or a first conductivity type bonding pad, a second conductivity type bonding pad, a first conductivity type extension electrode, and a second conductivity type extension electrode wherein the first conductivity type extension electrode and the second conductivity type extension electrode have three-dimensional crossover, and partial of the first conductivity type extension electrode and the first conductivity type contact zone or the first conductivity type bonding pad are on the opposite sides of the active layer.

17 Claims, 5 Drawing Sheets

(56) References Cited

U.S. PATENT DOCUMENTS

| | | | |
|---|---|---|---|
| 8,274,156 B2 * | 9/2012 | Chen | H01L 31/022408 257/459 |
| 8,692,280 B2 * | 4/2014 | Yeh | H01L 31/02005 257/776 |
| 2004/0012030 A1 * | 1/2004 | Chen et al. | 257/99 |
| 2008/0230791 A1 * | 9/2008 | Lin et al. | 257/91 |
| 2008/0251808 A1 * | 10/2008 | Kususe et al. | 257/98 |
| 2008/0315240 A1 | 12/2008 | Kim et al. | |
| 2009/0008668 A1 | 1/2009 | Matsumura | |
| 2009/0039359 A1 * | 2/2009 | Yoon | H01L 33/382 257/88 |
| 2009/0179217 A1 | 7/2009 | Xuan et al. | |
| 2010/0187559 A1 | 7/2010 | Han | |

* cited by examiner

OPTOELECTRONIC SEMICONDUCTOR DEVICE

CROSS REFERENCE TO RELATED APPLICATIONS

The present application is a Continuation application of U.S. patent application Ser. No. 12/591,617, filed Nov. 25, 2009.

BACKGROUND

1. Technical Field

An optoelectronic semiconductor device is disclosed, especially related to a layout of an electrode structure of the optoelectronic semiconductor device.

2. Reference to Related Application

This application claims the right of priority based on TW application Ser. No. 097146075, filed Nov. 26, 2008, entitled "OPTOELECTRONIC SEMICONDUCTOR DEVICE", and the contents of which are incorporated herein by reference.

3. Description of the Related Art

The current crowding effect refers to an uneven distribution of current density occurred commonly in conventional light emitting devices. It accumulates heat locally in the lighting device and decreases the lighting efficiency. For the worse case, it damages the lighting device.

The layout of the electrode structure of the light emitting device is for the purpose of spreading the current driving into the semiconductor layer more evenly and solving the issue of current crowding. The key factors for consideration are the distance of the p-type electrode and the n-type electrode, and the positions of the pads and the fingers. However, as the chip size and the driving voltage of the light emitting device increases, the current flow to the end side of the finger is influenced by the accumulated resistance and therefore is not spread uniformly.

The layout of the electrode structure of the vertical type chip has the n-type electrode and the p-type electrode positioned in the opposite sides of the chip. But in this design, the epitaxial substrate needs to be removed to expose the first conductivity type semiconductor layer connected to the substrate so the first electrode can be formed on the exposed surface. Besides, a reflecting layer, a second electrode and a permanent substrate are formed on the second conductivity type semiconductor layer of the surface of the epitaxial structure. The process is complicated so it is difficult to maintain the yield and the cost is high.

SUMMARY

An optoelectronic semiconductor device includes a substrate, a semiconductor system having an active layer formed on the substrate and an electrode structure formed on the semiconductor system, wherein the layout of the electrode structure having at least a first conductivity type contact zone or a first conductivity type bonding pad, a second conductivity type bonding pad, a first conductivity type extension electrode, and a second conductivity type extension electrode wherein the first conductivity type extension electrode and the second conductivity type extension electrode have three-dimensional crossover, and a portion of the first conductivity type extension electrode and the first conductivity type contact zone or the first conductivity type bonding pad are on the opposite sides of the active layer.

With the three-dimensional crossover arrangement, the design of the electrodes of different conductivity types in the light emitting diode (including the bonding pads and the extension electrodes) is more flexible, and its manufacturing process is more stable with low cost.

BRIEF DESCRIPTION OF THE DRAWINGS

The accompanying drawings are included to provide easy understanding of the application, and are incorporated herein and constitute a part of this specification. The drawings illustrate embodiments of the application and, together with the description, serve to illustrate the principles of the application.

DESCRIPTION OF THE PREFERRED EMBODIMENTS

Figure 1:
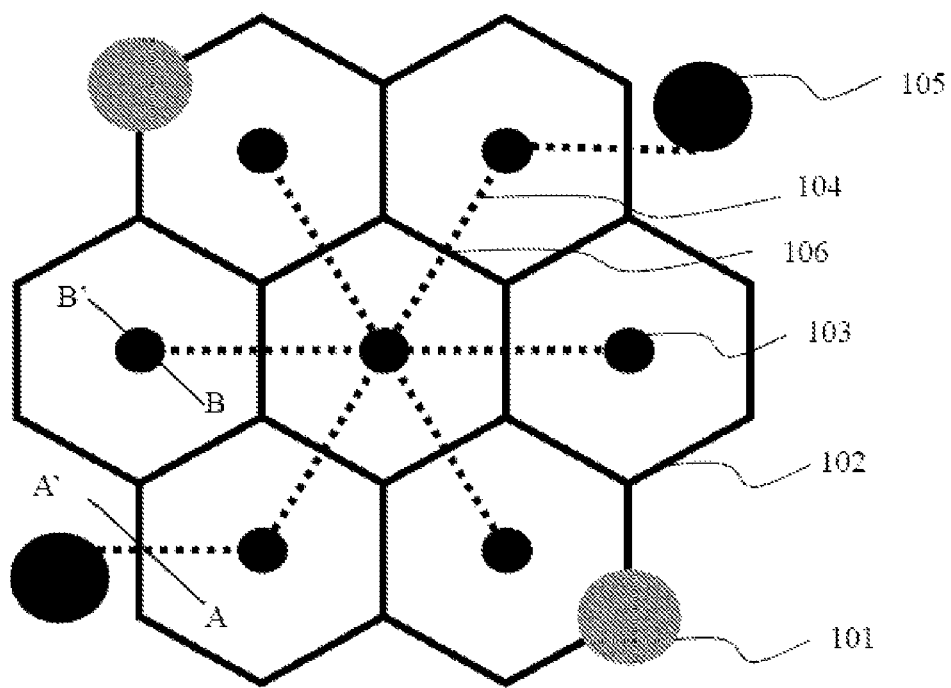
FIG. 1 illustrates a top view of the electrode structure of the optoelectronic semiconductor device in accordance with the first embodiment of the present application.

Reference is made in detail to the preferred embodiments of the present application, examples of which are illustrated in the accompanying drawings. Wherever possible, the same reference numbers are used in the drawings and the description to refer to the same or like parts.

FIG. 1 shows a top view of the electrode structure of the optoelectronic semiconductor device in accordance with the first embodiment of the present application. The device includes at least a p-type bonding pad 101, a plurality of p-type extension electrodes 102, a plurality of n-type contact zones 103, a plurality of n-type extension electrodes 104 and at least an n-type bonding pad 105. The p-type extension electrodes 102 form a plurality of symmetrical closed patterns, and at least a p-type bonding pad 101 is formed on the p-type extension electrodes 102. The n-type contact zone 103 is disposed in the symmetrical closed pattern mentioned above and electrically connected to the plurality of n-type extension electrodes 104. Besides, the p-type extension electrodes 102 and the n-type extension electrodes 104 are electrically connected to the p-type bonding pad 101 and the n-type bonding pad 105 respectively. In this embodiment, the p-type extension electrodes 102 and the n-type extension electrodes 104 is separated by an insulating layer at the three-dimensional crossover 106. The material of the electrode structure mentioned above can be metal material such as Cr, Ti, Ni, Pt, Cu, Au, Al, or Ag.

The first embodiment is described hereinafter in accompany with drawings FIG. 1, FIG. 2A and FIG. 2B. An optoelectronic semiconductor device includes a semiconductor system formed on a substrate 201 and an electrode structure formed on the semiconductor system. A semiconductor system is referred as a semiconductor device, equipment, product, circuit, or application that can proceed or induce the light energy and electrical energy transfer. Specifically speaking, a semiconductor system includes a light-emitting diode (LED), a laser diode (LD), a solar cell, a liquid crystal display, or an organic light-emitting diode. The phrase "semiconductor system" in the specification does not require that all the subsystems or units in the system are semiconductor materials. Other non-semiconductor materials such as metal, oxide, insulator and so on can also be optionally integrated in the semiconductor system.

In accordance with the first embodiment in the application, a semiconductor system includes at least a first conductivity type layer 202, an active layer 203, and a second conductivity type layer 204. The first conductivity type layer 202 and the second conductivity type layer 204 are two single-layer structures or two multiple layers structure ("multiple layers" means two or more than two layers) having different electrical properties, polarities, dopants for providing electrons or holes respectively. If the first conductivity type layer 202 and the second conductivity type layer 204 are composed of the semiconductor materials, and the conductivity type can be any two of p-type, n-type, and i-type. The active layer 203 disposed between the first conductivity type layer 202 and the second conductivity type layer 204 is a region where the light energy and the electrical energy could transfer or could be induced to transfer. The device transferring the electrical energy to the light energy can be a light-emitting diode, a liquid crystal display, or an organic light-emitting diode; the device transferring the light energy to the electrical energy can be a solar cell or an optoelectronic diode.

Taking the light-emitting diode as an example, the light emission spectrum after transformation can be adjusted by changing the physical or chemical arrangement of one layer or more layers in the semiconductor system. The materials commonly used are aluminum gallium indium phosphide (AlGaInP) series material, aluminum gallium indium nitride (AlGaInN) series material, zinc oxide (ZnO) series material and so on. The active layer 203 can be a single heterostructure (SH), a double heterostructure (DH), a double-side double heterostructure (DDH), or a multi-quantum well (MWQ). Besides, the wavelength of the emitting light can also be adjusted by changing the number of the pairs of the quantum well.

The substrate 201 is used for growing or carrying the semiconductor system, and the suitable material includes but is not limited to germanium (Ge), gallium arsenide (GaAs), indium phosphide (InP), sapphire, silicon carbide (SiC), silicon (Si), lithium aluminum oxide (LiAlO$_2$), zinc oxide (ZnO), gallium nitride (GaN), aluminum nitride (AlN), glass, composite material, diamond, CVD diamond, diamond-like carbon (DLC) and so on.

A transition layer (not shown) is optionally formed between the substrate 201 and the semiconductor system. The transition layer is disposed between two material systems to transit a material system like the substrate to another material system like the semiconductor material system. For the light-emitting diode structure, on one hand, the transition layer can be a layer like the buffer layer to reduce the lattice mismatch between two material systems. On the other hand, the transition layer can also be a single layer, multiple layers, or a structure to combine two materials or two separated structures where the material can be organic, inorganic, metal, semiconductor and so on, and the structure can be a reflective layer, a heat conducting layer, an electrical conducting layer, an ohmic contact layer, an anti-deformation layer, a stress release layer, a stress adjustment layer, a bonding layer, a wavelength converting layer, a mechanical fixing structure and so on.

A contact layer (not shown) can also be optionally formed on the second conductivity layer 204. The contact layer is disposed on the side of the second conductivity layer 204 away from the active layer 203. Specifically speaking, the contact layer could be an optical layer, an electrical layer or the combination of the two. An optical layer can change the electromagnetic radiation or the light from or entering the active layer 203. The term "change" here means to change at least one optical property of the electromagnetic radiation or the light. The abovementioned property includes but is not limited to frequency, wavelength, intensity, flux, efficiency, color temperature, rendering index, light field, and angle of view. An electrical layer can change or be induced to change the value, density, or distribution of at least one of the voltage, resistance, current, or capacitance between any pair of the opposite sides of the contact layer. The composition material of the contact layer 16 includes at least one of oxide, conductive oxide, transparent oxide, oxide with 50% or higher transmittance, metal, relatively transparent metal, metal with 50% or higher transmittance, organic material, inorganic material, fluorescent material, phosphorescent material, ceramic, semiconductor, doped semiconductor, and undoped semiconductor. In certain applications, the material of the contact layer is at least one of indium tin oxide (ITO), cadmium tin oxide (CTO), antimony tin oxide, indium zinc oxide, zinc aluminum oxide, and zinc tin oxide. If the material is relatively transparent metal, the thickness is about 0.005 μm~0.6 μm.

The second conductivity layer 204 and the active layer 203 are etched to expose a portion of the discontinuous first conductivity type layer 202. An insulating layer 205 is formed on a specific region of the second conductivity layer 204 to avoid short when an n-type contact zone 208 formed in the following process directly contacts with the second conductivity layer 204 and the active layer 203. Afterwards, according to the layout design of the electrode structure, the positions of the n-type contact zone 208, a p-type extension electrode 206 and a p-type bonding pad (not shown) are defined by lithography, and metal material is formed on the defined area mentioned above by evaporation or electroplating to form the n-type contact zone 208, the p-type extension electrode 206 and the p-type bonding pad (not shown).

Next, the insulating layer 205 covers the surface of the device with high dielectric constant material like inorganic oxide or dielectric organic material such as SiOx, SiNx, Al2O3, TiOx. The n-type contact zone 208 and the p-type bonding pad (not shown) are exposed by lithography and etching process. Finally, the n-type bonding pad and the n-type extension electrode 207 are defined by lithography and metal material formed on the defined area mentioned above by evaporation or electroplating to form the n-type bonding pad and the n-type extension electrode 207 to complete the three-dimensional crossover electrode design of this application.

Figure 2A:
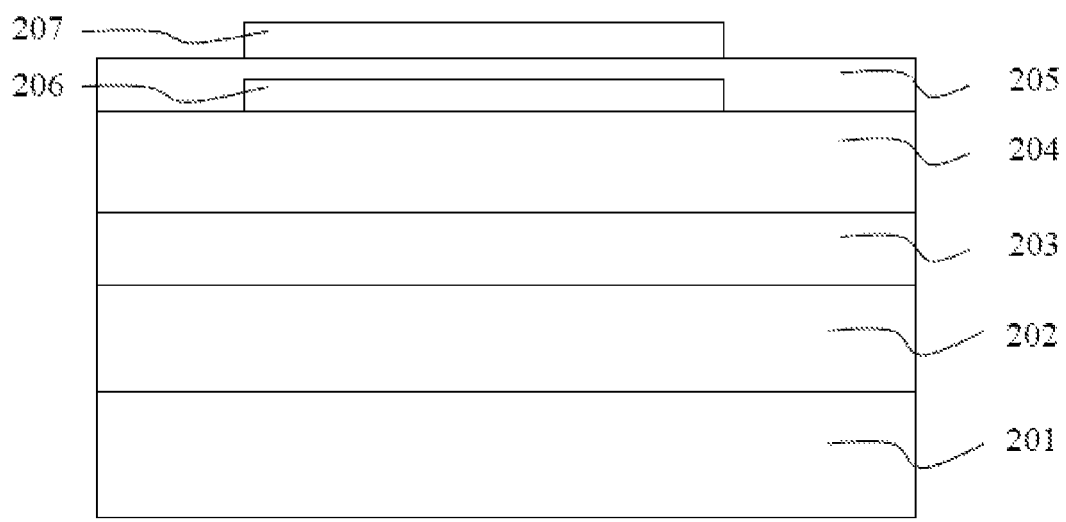
FIG. 2A illustrates a cross-sectional view of the crossover (A-A') of the p-type extension electrode and the n-type extension electrode of the optoelectronic semiconductor device in accordance with the first embodiment of the present application.

FIG. 2A illustrates a cross-sectional view of the crossover (A-A') of the p-type extension electrode 102 and the n-type extension electrode 104 of the optoelectronic semiconductor device in accordance with the first embodiment of the present application. The p-type extension electrode 206 is formed on the second conductivity type layer 204, and an insulating layer 205 is formed on the p-type extension electrode 206 and the second conductivity type layer 204. Finally, the n-type extension electrode 207 is formed on the insulating layer 205 and is electrically insulated from the p-type extension electrode 206. The three-dimensional crossover design of the electrode structure is formed accordingly.

Figure 2B:
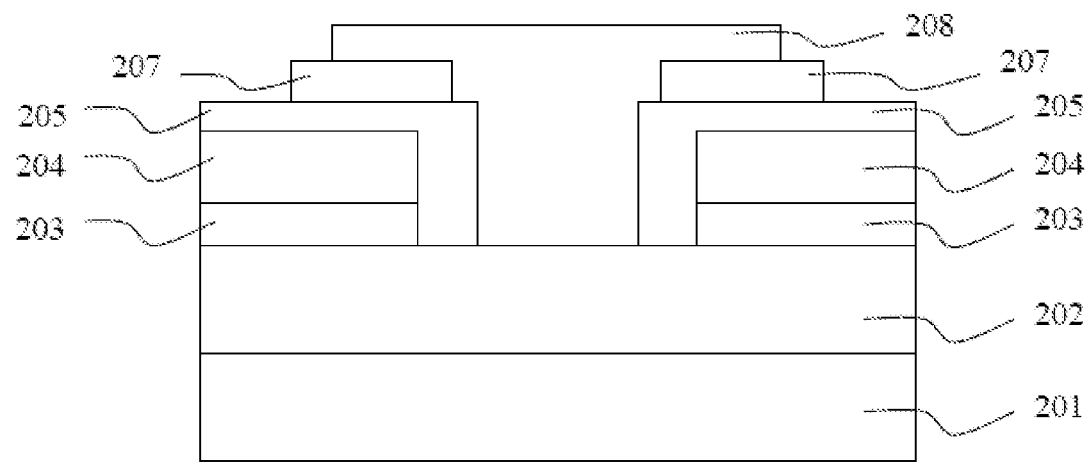
FIG. 2B illustrates a cross-sectional view of the n-type contact zone (B-B') of the optoelectronic semiconductor device in accordance with the first embodiment of the present application.

FIG. 2B illustrates a cross-sectional view of the n-type contact zone (B-B') of the optoelectronic semiconductor device in accordance with the first embodiment of the present application. After the insulating layer 205 is formed to cover the second conductivity type layer 204 and the active layer 203 mentioned above, an n-type extension electrode 207 is formed on the insulating layer 205 and is electrically insulated from the second conductivity type layer 204, and the n-type contact zone is formed with metal material. The metal material of the n-type contact zone 208 directly contacts with the first conductivity type layer 202, and the n-type extension electrode is formed on the active layer 203.

Figure 3:
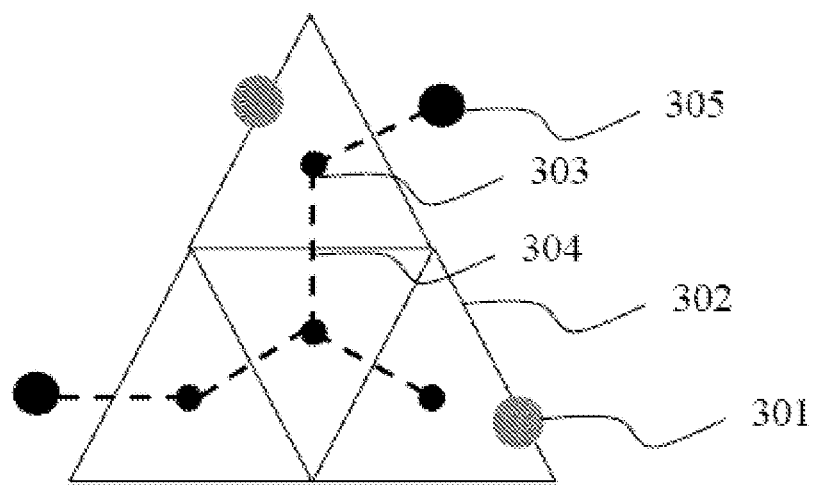
FIG. 3 illustrates a top view of the electrode structure of the optoelectronic semiconductor device in accordance with the second embodiment of the present application.
Figure 4:
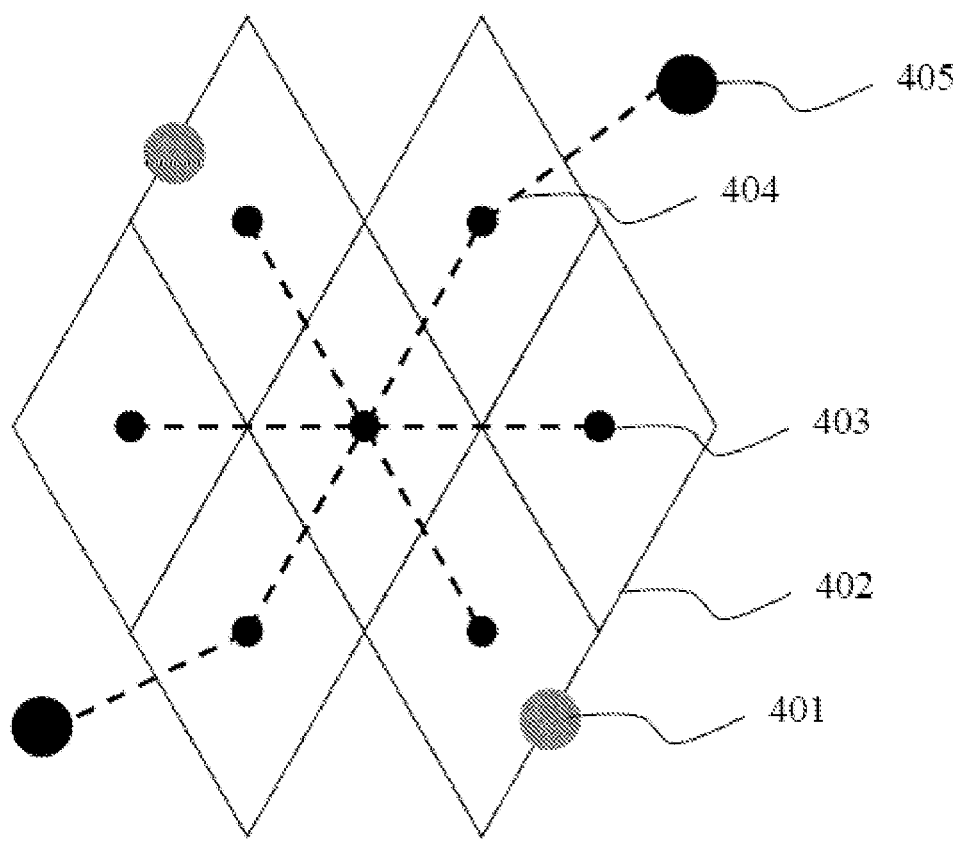
FIG. 4 illustrates a top view of the electrode structure of the optoelectronic semiconductor device in accordance with the third embodiment of the present application.

FIG. 3 and FIG. 4 illustrate top views of the layout of the electrode structure of the optoelectronic semiconductor device in accordance with the second and the third embodiments of the present application. The device shown in the drawings includes at least one p-type bonding pad 301, 401; a plurality of p-type extension electrodes 302, 402; a plurality of n-type contact zones 303, 403; a plurality of n-type extension electrodes 304, 404 and at least one n-type bonding pad 305, 405 wherein the p-type extension electrode 302, 402 forms a plurality of symmetrical closed patterns, and the n-type contact zones 303, 403 are formed in the symmetrical closed pattern mentioned above and electrically connected to each other by a plurality of n-type extension electrode 304, 404. Besides, the p-type extension electrodes 302, 402 and the n-type extension electrodes 304, 404 are electrically connected to the p-type bonding pads 301, 401 and the n-type bonding pads 305, 405 respectively. In this embodiment, the crossover of the p-type extension electrodes 302, 402 and the n-type extension electrodes 304, 404 are separated by the insulating layer to form a three-dimensional design for the electrode structure of this application.

Figure 5:
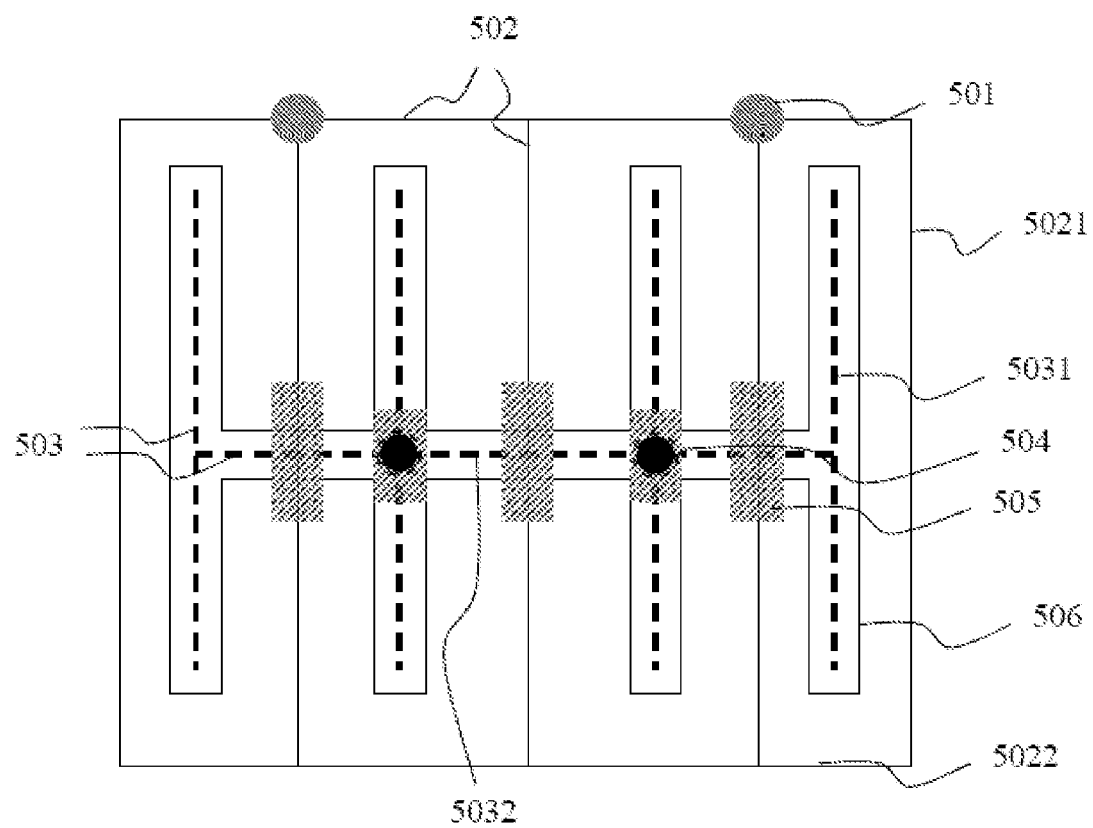
FIG. 5 illustrates a top view of the electrode structure of the optoelectronic semiconductor device in accordance with the fourth embodiment of the present application.
Figure 6:
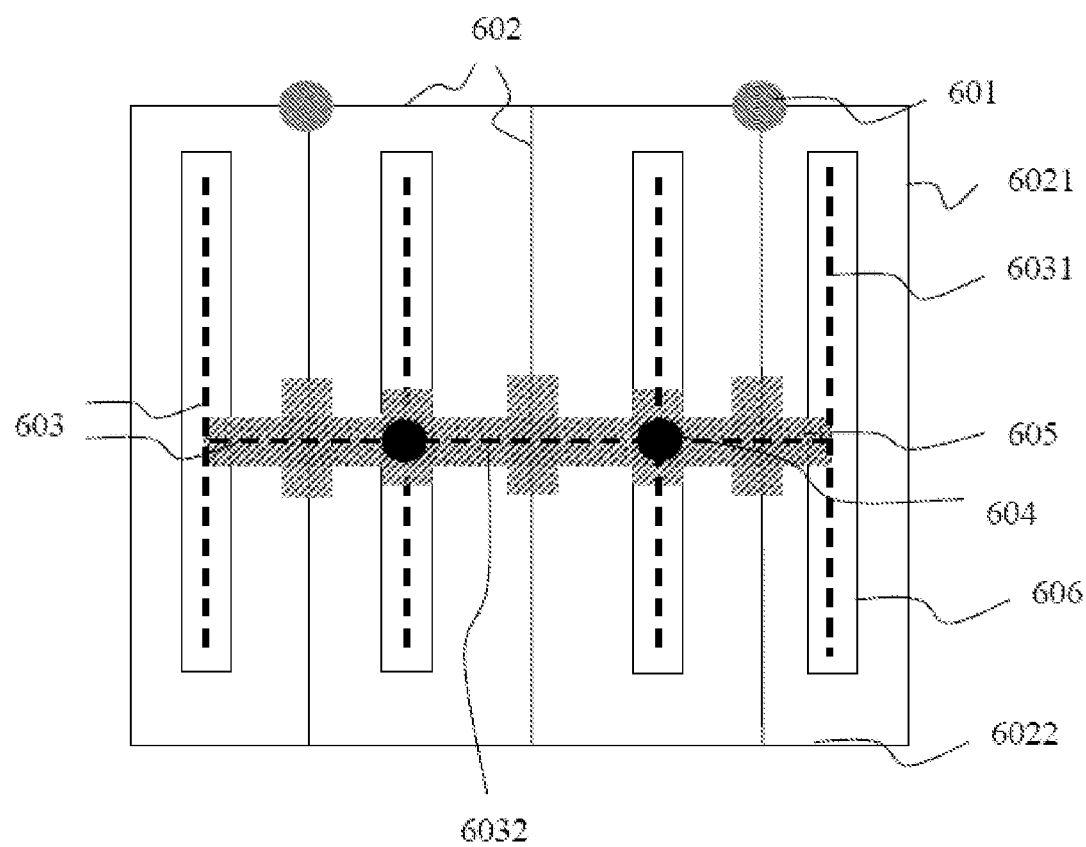
FIG. 6 illustrates a top view of the electrode structure of the optoelectronic semiconductor device in accordance with the fifth embodiment of the present application.

FIG. 5 and FIG. 6 illustrate another layout of the electrode structure of the optoelectronic semiconductor device of the present application. FIG. 5 illustrates a top view of the layout of the electrode structure of the optoelectronic semiconductor device in accordance with the fourth embodiment of the present application. The device shown in the drawing including at least one p-type bonding pad 501, a plurality of p-type extension electrodes 502, a plurality of n-type extension electrodes 503, at least an n-type bonding pad 504 and a plurality of insulating layers 505.

The p-type extension electrode 502 includes a plurality of perpendicular p-type extension electrodes 5021 and a plurality of lateral p-type extension electrodes 5022 to form a plurality of symmetrical closed patterns. A plurality of straight n-type extension electrodes 5031 and a plurality of lateral n-type extension electrodes 5032 are formed at the p-type extension electrodes 502 wherein part of the perpendicular p-type extension electrode 5021 and the lateral n-type extension electrode 5032 form the three-dimensional crossover. At least a p-type bonding pad is formed on the crossover of the perpendicular p-type extension electrode 5021 and the lateral p-type extension electrode 5022.

In this embodiment, the perpendicular n-type extension electrodes 5031 and the lateral n-type extension electrodes 5032 are formed in a trench 506 (represented by the line around the n-type extension electrodes in the FIG. 5 and FIG. 6) formed by etching the second conductivity type layer and the active layer to expose a portion of the first conductivity type layer so the n-type extension electrodes 503 are electrically connected to the first conductivity type layer. The detailed process is substantially the same with the first embodiment and can be referred thereto.

After the trench of the lateral n-type extension electrode 5032 is formed, the insulating layer 505 is formed on the crossover of the perpendicular p-type extension electrode 5021 and the lateral n-type extension electrode 5032. The perpendicular p-type extension electrode 5021 is then formed on the insulating layer 505 to form the three-dimensional crossover for two different conductivity type electrodes.

At least one n-type bonding pad 504 is formed on the crossover of the perpendicular n-type extension electrode 5031 and the lateral n-type extension electrode 5032. The n-type bonding pad 504 is disposed on the active layer by forming the insulating layer 505 on the trench 506 of the n-type extension electrode 503. The n-type bonding pad 504 is electrically connected to the n-type extension electrode 503 on the insulating layer through the wire (not shown).

FIG. 6 illustrates a top view of the layout of the electrode structure of the optoelectronic semiconductor device in accordance with the fifth embodiment of the present application. The embodiment includes at least one p-type bonding pad 601, a plurality of p-type extension electrodes 602, a plurality of n-type extension electrodes 603, at least one n-type bonding pad 604 and at least one lateral insulating layer 605.

The p-type extension electrode 602 forms a plurality of symmetrical closed patterns including a plurality of perpendicular p-type extension electrodes 6021 and a plurality of lateral p-type extension electrodes 6022. A plurality of perpendicular n-type extension electrodes 6031 and a plurality of lateral n-type extension electrodes 6032 are formed at the p-type extension electrode 602 wherein a portion of the perpendicular p-type extension electrode 6021 and the lateral n-type extension electrode 6032 form the three-dimensional crossover. At least one p-type bonding pad 601 is formed on the crossover of the p-type extension electrode 6021 and the lateral p-type extension electrode 6022.

In this embodiment, the perpendicular n-type extension electrode 6031 is formed in a trench 606 (represented by the line around the n-type extension electrode in the FIG. 5 and FIG. 6) by etching the second conductivity type layer and the active layer to expose a portion of the first conductivity type layer so the n-type extension electrodes 603 are electrically connected to the first conductivity type layer. The detailed process is substantially the same with the first embodiment and can be referred thereto.

After the trench of the perpendicular n-type extension electrode 6031 is formed, the lateral insulating layer 605 is formed on the crossover of the perpendicular p-type extension electrode 6021 and the later formed lateral n-type extension electrode 6032. The lateral n-type extension electrode 6032 is electrically connected to the perpendicular n-type extension electrode 6031 wherein the lateral n-type extension electrode 6032 and the perpendicular p-type extension electrode 6021 are formed on the lateral insulating layer 605 to form the three-dimensional crossover for two different conductivity type electrodes.

At least one n-type bonding pad 604 is formed on the crossover of the perpendicular n-type extension electrode 6031 and the lateral n-type extension electrode 6032, and is electrically connected to the lateral n-type extension electrode 6032. Instead of forming a trench, the n-type bonding pad 604 is exposed for wiring. In other embodiment, the n-type bonding pad 604 can be formed in the trench and electrically connected to the first conductivity layer and other wires directly.

The optoelectronic semiconductor device mentioned above may be mounted with the substrate side down onto a submount via a solder bump or a glue material to form a light-emitting apparatus. Besides, the submount further comprises at least one circuit electrode layout structure electrically connected to the electrode of the light-emitting device via an electrical conductive structure, such as a metal wire. The submount mentioned above can be a lead frame or a mounting substrate to make the circuit design easily and improve the heat dissipation.

Comparing to the prior art, the layout of the electrode structure of the application has more advantages such as: there is no need to keep the p-type extension electrode a certain distance from the n-type extension electrode. In this application, the second conductivity type extension electrode forms a semi-enclosed or closed pattern and the first conductivity type extension electrode is formed in the central region of the closed pattern to contact the surface of the second conductivity type layer by leaps. The layout of the electrode structure of this application is separated into several geometric symmetry subunit (semi-enclosed or closed patterns) and makes the current spread into the light emitting diode uniformly. Therefore, when the chip size of the light emitting diode is extensively increased, the electrode layout can be easily modified by increasing the subunit mentioned above.

Besides, the n-type extension electrode and the n-type contact zone or the n-type bonding pad in this application is designed to form at the opposite sites of the active layer and to have three-dimensional crossover with the p-type extension electrode. There is no need to remove excessive semiconductor layer in comparison with the prior art method. The area loss caused by the design is decreased and the light-emitting efficiency is increased.

Although the drawings and the illustrations above are corresponding to the specific embodiments individually, the element, the practicing method, the designing principle, and the technical theory can be referred, exchanged, incorporated, collocated, coordinated except they are conflicted, incompatible, or hard to be put into practice together.

Although the present application has been explained above, it is not the limitation of the range, the sequence in practice, the material in practice, or the method in practice. Any modification or decoration for present application is not detached from the spirit and the range of such.

What is claimed is:

1. An optoelectronic device, comprising:
   a light emitting stack comprising a first conductivity type layer; a second conductivity type layer formed on the first conductivity type layer; and an active layer formed between the first conductivity type layer and the second conductivity type layer for emitting light;
   a plurality of depressions extending from a top surface of the second conductivity type layer to the first conductivity type layer;
   a first extension electrode formed on the second conductivity type layer;
   a second extension electrode comprising a plurality of closed patterns, wherein the first extension electrode crosses over the second extension electrode on the second conductivity type layer; and
   a plurality of first contact zones, wherein each of the plurality of first contact zones is formed in a respective one of each of the plurality of depressions and each of the plurality of closed patterns, and is electrically connected to the first conductivity type layer and the first extension electrode;
   wherein the light emitting stack comprises a region between the plurality of closed patterns and the plurality of first contact zones from a top view, and the region is devoid of the second extension electrode, and the light emitted from the active layer is capable of being extracted from the region.

2. The optoelectronic device of claim 1, wherein the second extension electrode comprises a plurality of linear segments arranged to form perimeter edges of the plurality of closed patterns.

3. The optoelectronic device of claim 2, wherein the plurality of the closed patterns forms a second pattern.

4. The optoelectronic device of claim 1, wherein the first extension electrode has a first distance to the first conductivity type layer, the second extension electrode has a second distance to the first conductivity type layer, and the first distance is greater than the second distance.

5. The optoelectronic device of claim 1, further comprising an insulation layer arranged at a crossover between the first extension electrode and the second extension electrode.

6. The optoelectronic device of claim 1, further comprising a first bonding pad, wherein each of the plurality of depressions comprises a via exposing the first conductivity type layer, and the first bonding pad is electrically connected to the first extension electrode.

7. The optoelectronic device of claim 6, wherein a second bonding pad is arranged on the second conductivity type layer at a distance from the via.

8. The optoelectronic device of claim 1, wherein the first extension electrode comprises a plurality of fingers.

9. The optoelectronic device of claim 1, wherein the plurality of closed patterns is a plurality of geometric patterns.

10. An optoelectronic device, comprising:
    a first conductivity type layer;
    a second conductivity type layer formed on the first conductivity type layer;
    a depression extending from a top surface of the second conductivity type layer to the first conductivity type layer;
    a first extension electrode formed on the second conductivity type layer;
    a second extension electrode formed on the second conductivity type layer; and
    a first contact zone, formed in the depression, and electrically connected to the first conductivity type layer and the first extension electrode;
    wherein the first extension electrode crosses over a first portion of the second extension electrode, the first extension electrode does not cross over a second portion of the second extension electrode, and an area of the second portion is greater than an area of the first portion from a top view.

11. The optoelectronic device of claim 10, wherein the second extension electrode further comprises a plurality of closed patterns and the first contact zone is formed in one of the plurality of closed patterns.

12. The optoelectronic device of claim 10, wherein the second extension electrode comprises a plurality of closed patterns, and a perimeter edge of the plurality of closed patterns is a linear segment.

13. The optoelectronic device of claim 12, wherein the plurality of closed patterns are geometric patterns.

14. The optoelectronic device of claim 10, further comprising an insulation layer arranged at a crossover between the first extension electrode and the second extension electrode.

15. The optoelectronic device of claim 10, wherein the second extension electrode surrounds the first extension electrode.

16. The optoelectronic device of claim 10, further comprising a first bonding pad, wherein the depression comprises a via exposing the first conductivity type layer and a first bonding pad is electrically connected to the first extension electrode and is arranged within the via.

17. An optoelectronic device, comprising:
a light-emitting stack comprising: a first conductivity type layer; a second conductivity type layer formed on the first conductivity type layer; and an active layer formed between the first conductivity type layer and the second conductivity type layer for emitting light;
a plurality of depressions extending from a top surface of the second conductivity type layer to the first conductivity type layer;
a first extension electrode formed on the second conductivity type layer;
a second extension electrode formed on the second conductivity type layer; and
a plurality of first contact zones, formed in the depressions and a plurality of closed patterns respectively, and electrically connected to the first conductivity type layer and the first extension electrode;
wherein the first extension electrode crosses over a first portion of the second extension electrode, the first extension electrode does not cross over a second portion of the second extension electrode, and an area of the second portion is greater than an area of the first portion from a top view, the light emitting stack comprises a region between the plurality of closed patterns and the plurality of first contact zones from a top view, the region is devoid of the second extension electrode, and light emitted from the active layer is capable of being extracted from the region.

* * * * *